US012805118B2

(12) United States Patent
Mizusaki

(10) Patent No.: US 12,805,118 B2
(45) Date of Patent: Nov. 17, 2026

(54) LIGHT-EMITTING ELEMENT AND DISPLAY DEVICE

(71) Applicant: Sharp Display Technology Corporation, Kameyama City (JP)

(72) Inventor: Masanobu Mizusaki, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 364 days.

(21) Appl. No.: 18/574,697

(22) PCT Filed: Aug. 16, 2021

(86) PCT No.: PCT/JP2021/029870
§ 371 (c)(1),
(2) Date: Dec. 27, 2023

(87) PCT Pub. No.: WO2023/021542
PCT Pub. Date: Feb. 23, 2023

(65) Prior Publication Data

US 2024/0324278 A1 Sep. 26, 2024

(51) Int. Cl.

| | |
|---|---|
| ***H10K 50/858*** | (2023.01) |
| ***H10K 50/818*** | (2023.01) |
| ***H10K 50/828*** | (2023.01) |
| ***H10K 50/852*** | (2023.01) |
| *H10K 101/30* | (2023.01) |

(52) U.S. Cl.
CPC ......... *H10K 50/858* (2023.02); *H10K 50/818* (2023.02); *H10K 50/828* (2023.02); *H10K 50/852* (2023.02); *H10K 2101/30* (2023.02)

(58) Field of Classification Search
None
See application file for complete search history.

(56) References Cited

U.S. PATENT DOCUMENTS

| | | | | |
|---|---|---|---|---|
| 2007/0024168 | A1 | 2/2007 | Nishimura et al. | |
| 2016/0359143 | A1 | 12/2016 | Osawa et al. | |
| 2019/0198788 | A1 | 6/2019 | Park et al. | |
| 2020/0328368 | A1 * | 10/2020 | Chung ................. | H10K 50/115 |
| 2024/0132468 | A1 * | 4/2024 | Galán García ...... | C07D 251/10 |

FOREIGN PATENT DOCUMENTS

| | | | |
|---|---|---|---|
| JP | 2007-265638 | A | 10/2007 |
| JP | 2015-090817 | A | 5/2015 |
| JP | 2016-225221 | A | 12/2016 |

* cited by examiner

*Primary Examiner* — Nilufa Rahim
(74) *Attorney, Agent, or Firm* — ScienBiziP, P.C.

(57) ABSTRACT

A hole generation layer has a hole transport material having a smaller refractive index than at least one of the refractive index of a lower light-emitting layer and the refractive index of an upper light-emitting layer, and the hole generation layer has an electron-accepting compound. An electron-accepting compound ratio is 10 to 50% inclusive, wherein the electron-accepting compound ratio is the weight ratio of the electron-accepting compound contained in the hole generation layer to the weight of the hole generation layer.

20 Claims, 12 Drawing Sheets

(TAPC)

COMPOUND GROUP A

COMPOUND GROUP B

| | ELECTRON-ACCEPTING COMPOUND RATIO (%) | EFFICIENCY (EQE) (%) | CIEx | CIEy | cd/A/y | LIFETIME LT95 (25°C) (h) |
|---|---|---|---|---|---|---|
| LIGHT-EMITTING ELEMENT 101 | 1 | 28. 8 | 0. 150 | 0. 028 | 313 | 30 |
| | 5 | 28. 8 | 0. 150 | 0. 028 | 314 | 31 |
| | 10 | 29. 5 | 0. 150 | 0. 028 | 325 | 38 |
| | 15 | 30. 1 | 0. 150 | 0. 028 | 340 | 48 |
| | 20 | 30. 3 | 0. 150 | 0. 028 | 352 | 55 |
| | 30 | 31 | 0. 150 | 0. 027 | 355 | 54 |
| | 40 | 31 | 0. 150 | 0. 027 | 363 | 58 |
| | 50 | 32. 5 | 0. 150 | 0. 028 | 363 | 52 |
| | 60 | 32. 5 | 0. 15 | 0. 028 | 362 | 51 |
| SINGLE ELEMENT A | — | 14. 1 | 0. 15 | 0. 04 | 195 | 34 |

| | ELECTRON-ACCEPTING COMPOUND RATIO (%) | EFFICIENCY (EQE) (%) | CIEx | CIEy | cd/A/y | LIFETIME LT95 (25°C) (h) |
|---|---|---|---|---|---|---|
| LIGHT-EMITTING ELEMENT 101 | 1 | 25.1 | 0.150 | 0.028 | 300 | 32 |
| | 5 | 25 | 0.150 | 0.028 | 298 | 35 |
| | 10 | 30.3 | 0.150 | 0.027 | 315 | 38 |
| | 15 | 30.4 | 0.150 | 0.028 | 315 | 39 |
| | 20 | 30.3 | 0.150 | 0.026 | 314 | 43 |
| | 30 | 32.1 | 0.150 | 0.027 | 320 | 43 |
| | 40 | 32.5 | 0.150 | 0.028 | 335 | 50 |
| | 50 | 32.2 | 0.150 | 0.029 | 322 | 45 |
| | 60 | 30 | 0.15 | 0.028 | 308 | 47 |
| SINGLE ELEMENT B | — | 12.3 | 0.149 | 0.041 | 189 | 36 |

| | ELECTRON-ACCEPTING COMPOUND RATIO (%) | EFFICIENCY (EQE) (%) | CIEx | CIEy | cd/A/y | LIFETIME LT95 (25°C) (h) |
|---|---|---|---|---|---|---|
| LIGHT-EMITTING ELEMENT 101 | 1 | 25.1 | 0.150 | 0.024 | 295 | 23 |
| | 5 | 25 | 0.150 | 0.024 | 313 | 23 |
| | 10 | 31.5 | 0.150 | 0.025 | 334 | 40 |
| | 15 | 33.2 | 0.150 | 0.024 | 340 | 48 |
| | 20 | 34.5 | 0.150 | 0.024 | 340 | 46 |
| | 30 | 34.5 | 0.150 | 0.025 | 337 | 50 |
| | 40 | 34.6 | 0.150 | 0.026 | 336 | 48 |
| | 50 | 34.1 | 0.150 | 0.025 | 325 | 43 |
| | 60 | 32 | 0.15 | 0.025 | 310 | 40 |
| SINGLE ELEMENT C | — | 13 | 0.15 | 0.04 | 188 | 32 |

| | EFFICIENCY (EQE) (%) | CIEx | CIEy | cd/A/y | LIFETIME LT95 (25°C) (h) |
|---|---|---|---|---|---|
| EXAMPLE 4 | 32.2 | 0.150 | 0.028 | 376 | 58 |
| COMPARATIVE EXAMPLE 1 | 28.7 | 0.150 | 0.029 | 327 | 54 |

FIG. 14
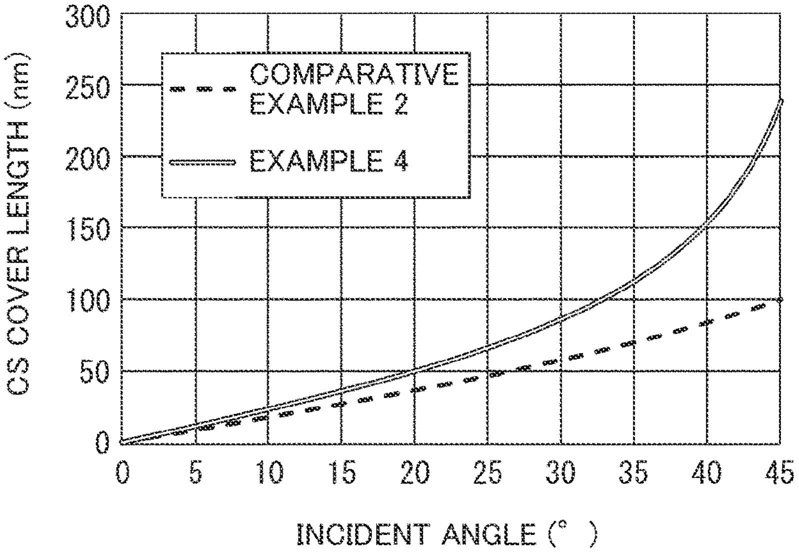
FIG. 15
| | EFFICIENCY (EQE) (%) | CIEx | CIEy | cd/A/y | LIFETIME LT95 (25°C) (h) |
|---|---|---|---|---|---|
| EXAMPLE 5 | 31. 2 | 0. 150 | 0. 028 | 323 | 47 |
FIG. 16
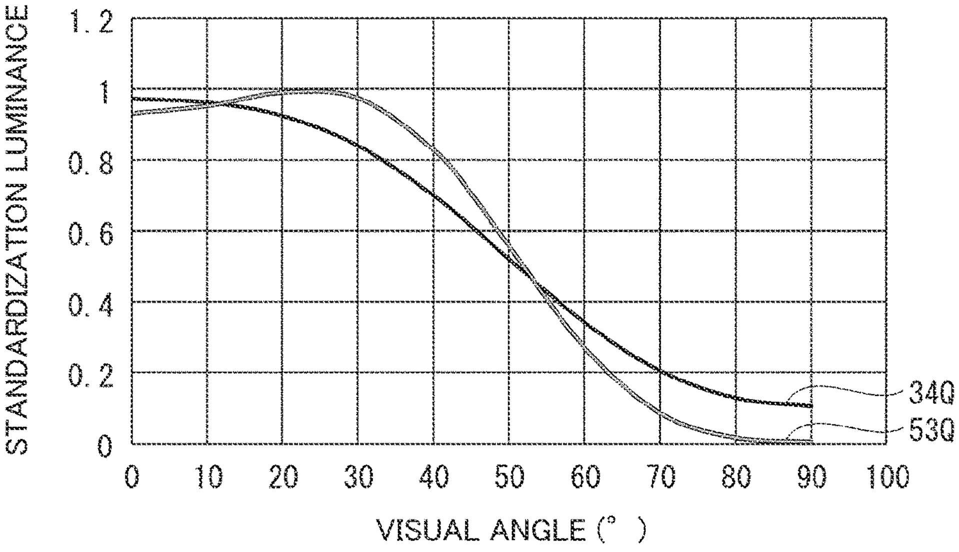

LIGHT-EMITTING ELEMENT AND DISPLAY DEVICE

TECHNICAL FIELD

The disclosure relates to a light-emitting element and a display device.

BACKGROUND ART

Tandem light-emitting elements have been known in the field of light-emitting elements. A tandem light-emitting element is a light-emitting element provided with a lower light-emitting layer and an upper light-emitting layer between its lower and upper electrodes. A tandem light-emitting element can emit higher-luminance light than a light-emitting element provided with a light-emitting layer that is a monolayer.

The technique disclosed in Patent Literature 1 deals with an example tandem light-emitting element. Patent Literature 1 discloses a tandem light-emitting element provided with a charge production layer (charge generation layer) between its first light-emitting unit (lower light-emitting layer) and its second light-emitting unit (upper light-emitting layer).

CITATION LIST

Patent Literature

Patent Literature 1: Japanese Unexamined Patent Application Publication No. 2016-225221

SUMMARY

Technical Problem

It is difficult in the technique disclosed in Patent Literature 1 to achieve a long-life tandem light-emitting element, because the charge production layer is susceptible to deterioration. That is, it is difficult for such a light-emitting element according to the known technique to achieve both high-luminance light emission and long life.

Solution to Problem

A light-emitting element according to one aspect of the disclosure includes the following: a lower electrode having light reflectivity; an upper electrode having light transparency and light reflectivity; a lower light-emitting layer and an upper light-emitting layer disposed between the lower electrode and the upper electrode; and a charge generation layer disposed between the lower light-emitting layer and the upper light-emitting layer. The charge generation layer has a hole generation layer configured to generate holes, and an electron generation layer configured to generate electrons. The hole generation layer has a hole transport material having a smaller refractive index than at least one of the refractive index of the lower light-emitting layer and the refractive index of the upper light-emitting layer, and the hole generation layer has an electron-accepting compound. An electron-accepting compound ratio is 10 to 50% inclusive, wherein the electron-accepting compound ratio is the weight ratio of the electron-accepting compound contained in the hole generation layer to the weight of the hole generation layer.

A display device according to one aspect of the disclosure includes the light-emitting element.

Advantageous Effect of Disclosure

The aspects of the disclosure can achieve both high-luminance light emission and long life.

BRIEF DESCRIPTION OF DRAWINGS

FIG. 14 is a graph showing the relationship in CS cover length with respect to an angle of light incident from an element body to the cap layer, between the light-emitting element according to Example 4 and the light-emitting element according to Comparative Example 2, where the normal of the lower and upper light-emitting layers is set at 0 degrees.

FIG. 15 is a table showing evaluations on the characteristics of a light-emitting element according to Example 5.

FIG. 16 is a graph showing the visual angle-standardization luminance characteristic of the lower light-emitting layer of the light-emitting element according to Example 5, and the visual angle-standardization luminance characteristic of the upper light-emitting layer of the light-emitting element according to Example 5.

DESCRIPTION OF EMBODIMENTS

An embodiment of the disclosure will be described below. It is noted that for convenience in description, components having the same functions as those of earlier described components will be denoted by the same sings, and that their description will not be repeated in some cases. It is also noted that a refractive index in the Description and others is a refractive index (absolute refractive index) with respect to a vacuum refractive index of 1.

Figure 1:
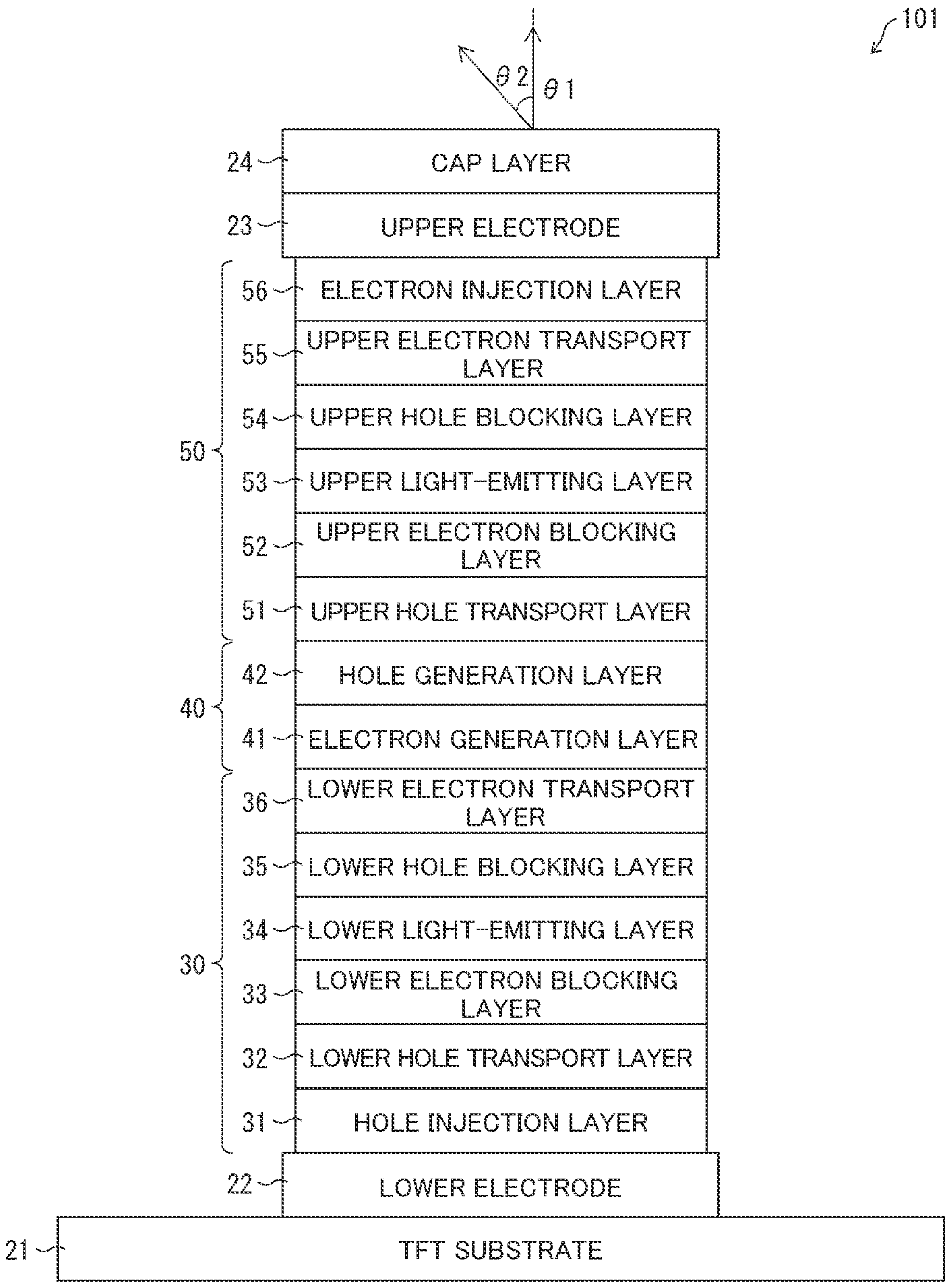
FIG. 1 is a sectional view of the schematic configuration of a light-emitting element according to an embodiment of the disclosure.

FIG. 1 is a sectional view of the schematic configuration of a light-emitting element 101 according to this embodiment. The light-emitting element 101 includes a TFT substrate 21, a lower electrode 22, a first layer 30, a charge generation layer 40, a second layer 50, an upper electrode 23, and a cap layer 24. The TFT substrate 21, the lower electrode 22, the first layer 30, the charge generation layer 40, the second layer 50, the upper electrode 23, and the cap layer 24 are stacked in the stated order.

The first layer 30 has a hole injection layer 31, a lower hole transport layer 32, a lower electron blocking layer 33, a lower light-emitting layer 34, a lower hole blocking layer 35, and a lower electron transport layer 36. The hole injection layer 31, the lower hole transport layer 32, the lower electron blocking layer 33, the lower light-emitting layer 34, the lower hole blocking layer 35, and the lower electron transport layer 36 are stacked in the stated order. Each of the hole injection layer 31, lower hole transport layer 32, lower electron blocking layer 33, lower hole blocking layer 35, and lower electron transport layer 36 is a charge function layer that contributes to at least one of the movement and generation of electric charges (electrons and holes).

The charge generation layer 40 has an electron generation layer 41 and a hole generation layer 42. The electron generation layer 41 and the hole generation layer 42 are stacked in the stated order. Each of the electron generation layer 41 and hole generation layer 42 is a charge function layer that contributes to at least one of the movement and generation of electric charges.

The second layer 50 has an upper hole transport layer 51, an upper electron blocking layer 52, an upper light-emitting layer 53, an upper hole blocking layer 54, an upper electron transport layer 55, and an electron injection layer 56. The upper hole transport layer 51, the upper electron blocking layer 52, the upper light-emitting layer 53, the upper hole blocking layer 54, the upper electron transport layer 55, and the electron injection layer 56 are stacked in the stated order. Each of the upper hole transport layer 51, upper electron blocking layer 52, upper hole blocking layer 54, upper electron transport layer 55, and electron injection layer 56 is a charge function layer that contributes to at least one of the movement and generation of electric charges.

The light-emitting element 101 is a tandem light-emitting element provided with the lower light-emitting layer 34 and upper light-emitting layer 53 between the lower electrode 22 and the upper electrode 23. The light-emitting element 101 can achieve higher-luminance light emission than a light-emitting element provided with a light-emitting layer that is a monolayer. The light-emitting element 101 is configured such that the charge generation layer 40 is disposed between the lower light-emitting layer 34 and the upper light-emitting layer 53. The light-emitting element 101 is an example top-emission (a structure where light is taken out from above) light-emitting element.

Figure 2:
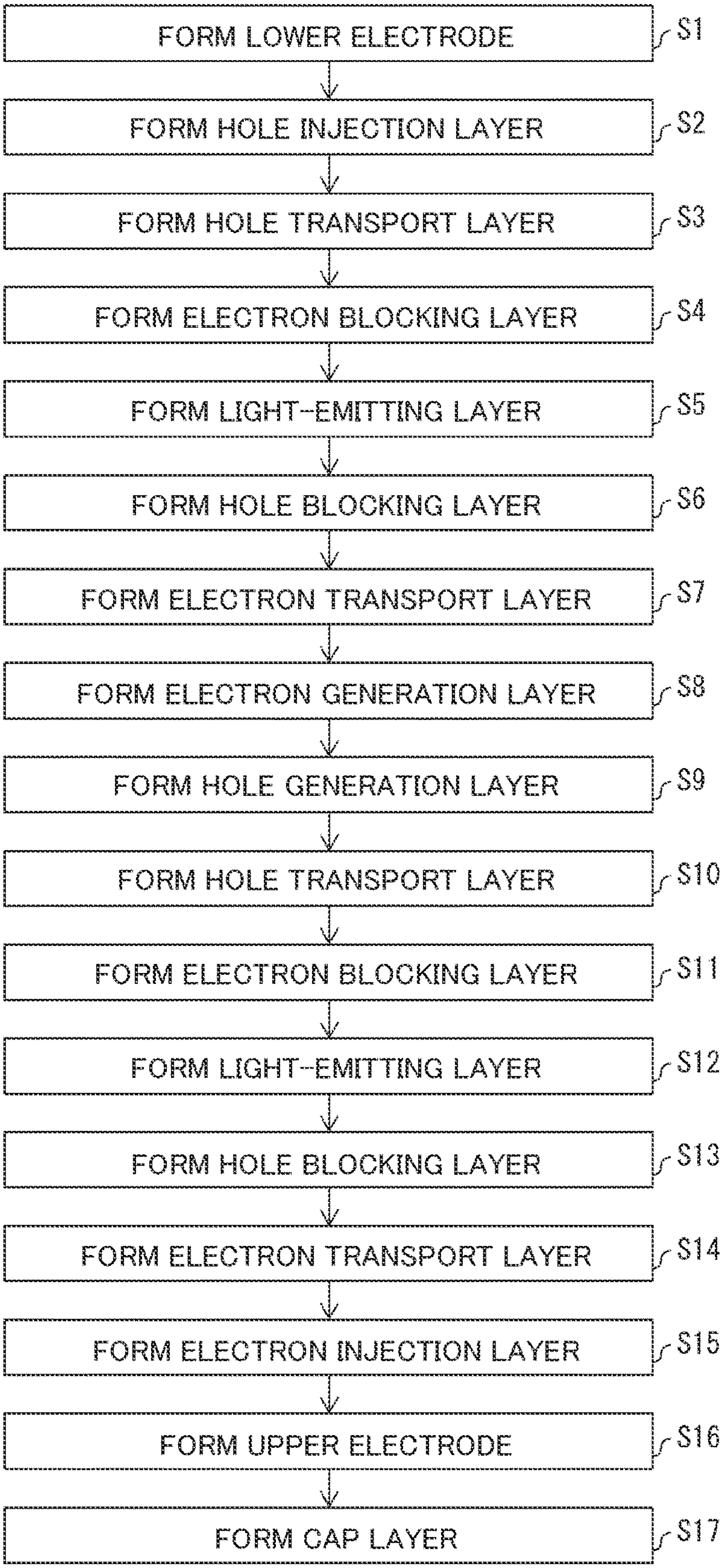
FIG. 2 is a flowchart showing an example method for manufacturing the light-emitting element illustrated in FIG. 1.

FIG. 2 is a flowchart showing an example method for manufacturing the light-emitting element 101. The process steps for manufacturing the light-emitting element 101 are roughly divided into Steps S1 to S17 shown in FIG. 2.

Step S1 is forming the lower electrode 22 onto the TFT substrate 21. The lower electrode 22 has light reflectivity. Herein, the lower electrode 22 is described as an anode. In Step S1, the lower electrode 22 is formed by, for instance, forming silver and indium tin oxide (ITO) in the stated order through sputtering.

Step S2 is forming the hole injection layer 31 onto the lower electrode 22. In Step S2, the hole injection layer 31 is formed through, for instance, simultaneous evaporation of a hole transport material and an electron acceptance material. The hole injection layer 31 has a thickness of 3 to 7 nm inclusive for instance.

Step S3 is forming the lower hole transport layer 32 onto the hole injection layer 31. In Step S3, the lower hole transport layer 32 is formed through, for instance, evaporation of a hole transport material. The lower hole transport layer 32 has a thickness of 50 to 120 nm inclusive for instance.

Step S4 is forming the lower electron blocking layer 33 onto the lower hole transport layer 32. In Step S4, the lower electron blocking layer 33 is formed through, for instance, evaporation of a hole transport material. The lower electron blocking layer 33 has a thickness of 3 to 50 nm inclusive for instance.

Step S5 is forming the lower light-emitting layer 34 onto the lower electron blocking layer 33. In Step S5, the lower light-emitting layer 34 is formed through, for instance, simultaneous evaporation of a light-emitting host and a dopant.

Step S6 is forming the lower hole blocking layer 35 onto the lower light-emitting layer 34. In Step S6, the lower hole blocking layer 35 is formed through, for instance, evaporation of an electron transport material. The lower hole blocking layer 35 has a thickness of 3 to 7 nm inclusive for instance.

Step S7 is forming the lower electron transport layer 36 onto the lower hole blocking layer 35. In Step S7, the lower electron transport layer 36 is formed through, for instance, evaporation of an electron transport material, or simultaneous evaporation of an electron transport material and lithium-quinoline. The lower electron transport layer 36 has a thickness of 10 to 30 nm inclusive for instance.

Step S8 is forming the electron generation layer 41 onto the lower electron transport layer 36. The electron generation layer 41 generates electrons. In Step S8, the electron generation layer 41 is formed through, for instance, simultaneous evaporation of materials listed as (1) and (2) below. The electron generation layer 41 has a thickness of 5 to 10 nm inclusive for instance.

(1) Electron transport material (2) Ytterbium or lithium

Figure 3:
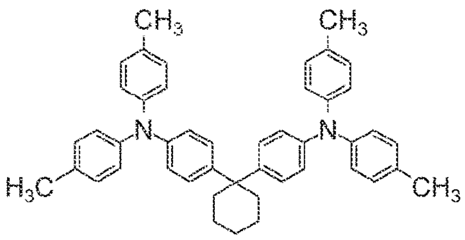
FIG. 3 illustrates TAPC.

Step S9 is forming the hole generation layer 42 onto the electron generation layer 42. The hole generation layer 42 generates holes. In Step S9, the hole generation layer 42 is formed through, for instance, simultaneous evaporation of a low-refractive-index hole transport material (TAPC, which is 1,1-bis(di-4-tolylaminophenyl)cyclohexane; see FIG. 3)

and an electron acceptance material. The hole generation layer 42 has a thickness of 1 to 10 nm inclusive for instance.

Preferable examples of the electron transport material contained in the electron generation layer 41 will be detailed later on. Preferable examples of each of the low-refractive-index hole transport material and electron acceptance material contained in the hole generation layer 42, as well as an electron-accepting compound contained therein will be detailed later on.

The electron generation layer 41 formed through Steps S8 and S9 is in contact with the hole generation layer 42 and is composed of a material with ytterbium or lithium added to the electron transport material. The hole generation layer 42 formed through Steps S8 and S9 is disposed closer to the upper electrode 23 than the electron generation layer 41.

Step S10 is forming the upper hole transport layer 51 onto the hole generation layer 42. Step S11 is forming the upper electron blocking layer 52 onto the upper hole transport layer 51. Step S12 is forming the upper light-emitting layer 53 onto the upper electron blocking layer 52. Step S13 is forming the upper hole blocking layer 54 onto the upper light-emitting layer 53. Step S14 is forming the upper electron transport layer 55 onto the upper hole blocking layer 54.

The upper hole transport layer 51, the upper electron blocking layer 52, the upper light-emitting layer 53, the upper hole blocking layer 54, and the upper electron transport layer 55 can be formed through, respectively, a method similar to that for forming the lower hole transport layer 32, a method similar to that for forming the lower electron blocking layer 33, a method similar to that for forming the lower light-emitting layer 34, a method similar to that for forming the lower hole blocking layer 35, and a method similar to that for forming the lower electron transport layer 36. However, the upper hole transport layer 51 has a thickness of 10 to 40 nm inclusive for instance, which is different from the example thickness (50 to 120 nm inclusive) of the lower hole transport layer 32.

Step S15 is forming the electron injection layer 56 onto the upper electron transport layer 55. In Step S15, the electron injection layer 56 is formed through, for instance, evaporation of lithium fluoride. The electron injection layer 56 has a thickness of 0.5 to 3 nm inclusive for instance.

Step S16 is forming the upper electrode 23 onto the electron injection layer 56. The upper electrode 23 has light transparency and light reflectivity. Herein, the upper electrode 23 is described as a cathode. In Step S16, the upper electrode 23 is formed by, for instance, forming a magnesium- and silver-containing electrode through sputtering.

Step S17 is forming the cap layer 24 onto the upper electrode 23. The cap layer 24 is provided in order to, but not limited to, protect the individual layers under the upper electrode 23. In Step S17, the cap layer 24 is formed through, for instance, evaporation of lithium fluoride. The cap layer 24 has a thickness of, for instance, 50 to 200 nm inclusive and is typically 100 nm thick. The lithium fluoride has a refractive index of 1.38 for instance.

It is noted that whether to use a fine metal mask (FMM) is determined every time the foregoing evaporation or simultaneous evaporation is performed. An FMM is preferably used in each of Steps S4 and S11, and each of Steps S5 and S12. On the other hand, an FMM does not have to be used other than these process steps. It is also noted that the forgoing evaporation and simultaneous evaporation are each performed at a predetermined temperature and at a predetermined rate.

It is also noted that for manufacturing a plurality of light-emitting elements 101, Step S4 may include regulating the thickness of the lower electron blocking layer 33 for each of the plurality of light-emitting elements 101. The same applies to the upper electron blocking layer 52 in Step S11. It is also noted that in this case, Step S5 may include subjecting the lower light-emitting layer 34 to simultaneous evaporation sequentially for each color (e.g., red, green, and blue) of light that is emitted by the plurality of light-emitting elements 101. The same applies to the upper light-emitting layer 53 in Step S12.

Figure 4:
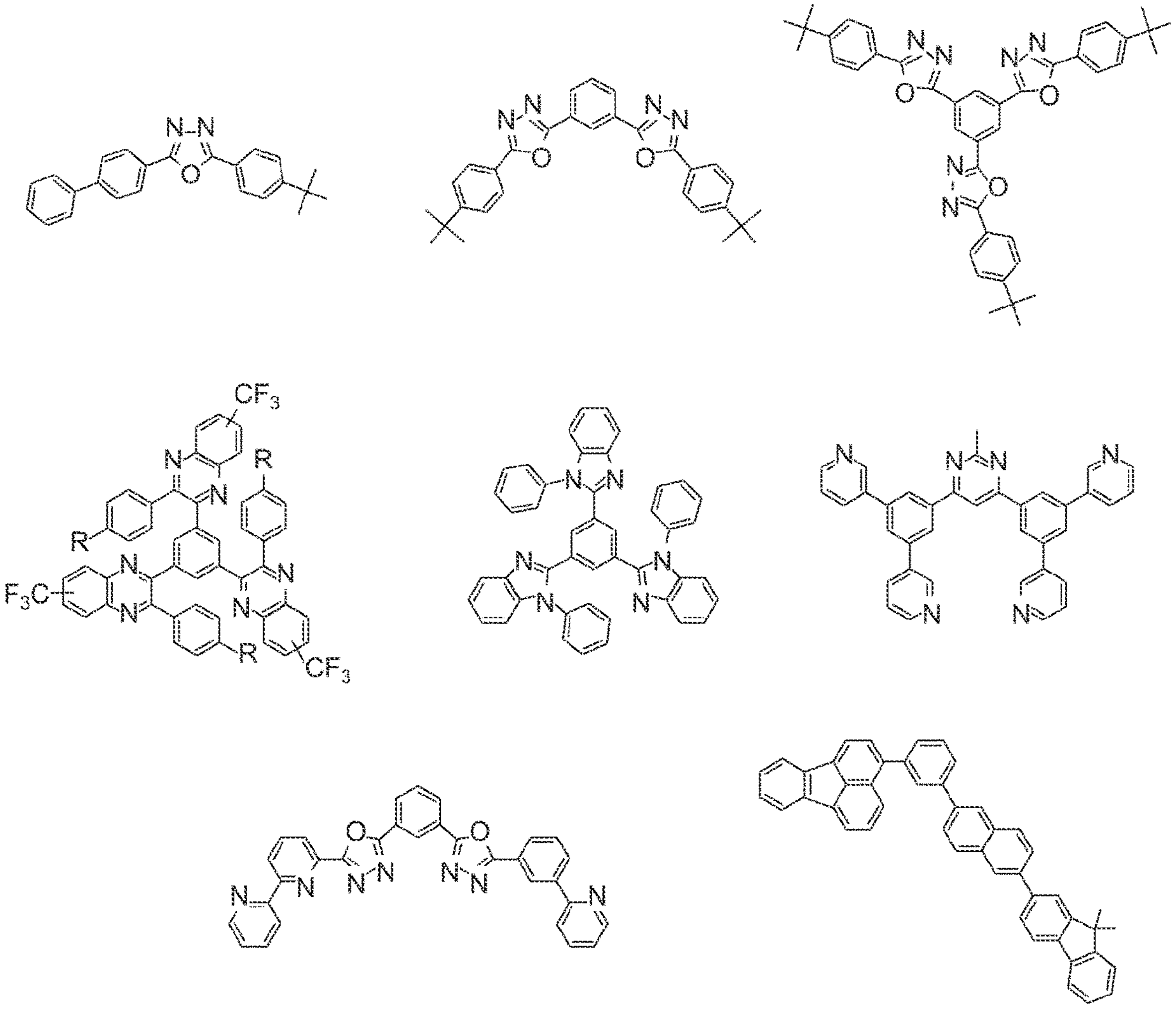
FIG. 4 illustrates examples of an electron transport material.
Figure 5:
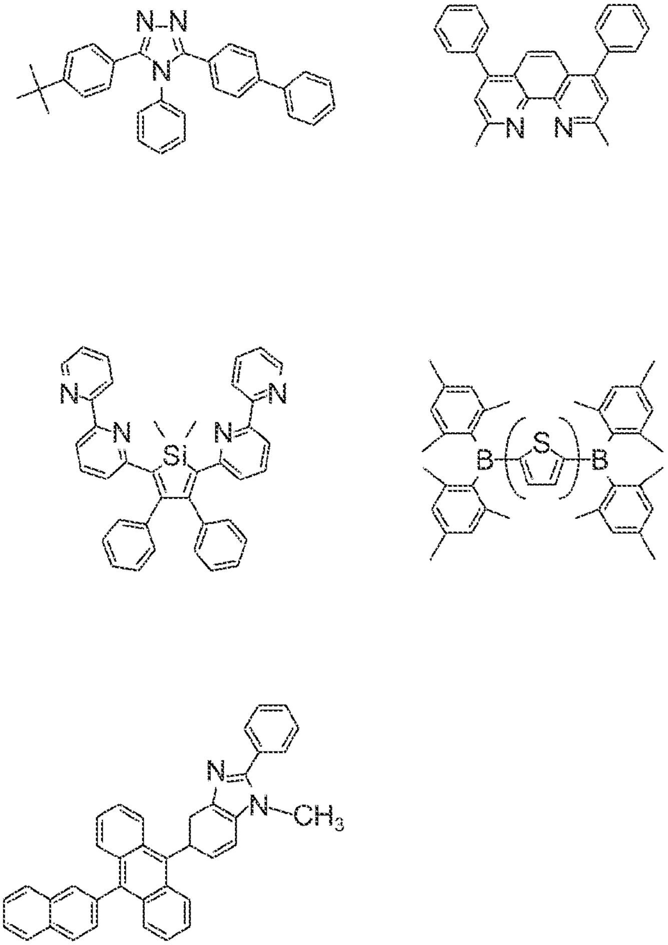
FIG. 5 illustrates other examples of the electron transport material.

An example of the electron transport material contained in the electron generation layer 41 is an organic electron-transporting material (see FIG. 4 and FIG. 5), such as an oxadiazole compound.

The low-refractive-index hole transport material contained in the hole generation layer 42 has a smaller refractive index than at least one of the refractive index of the lower light-emitting layer 34 and the refractive index of the upper light-emitting layer 53. To be specific, the refractive index of the low-refractive-index hole transport material is 0.90 times or greater and 0.95 times or smaller of at least one of the refractive index of the lower light-emitting layer 34 and the refractive index of the upper light-emitting layer 53. To be further specific, the low-refractive-index hole transport material has a refractive index of 1.70 to 1.90 inclusive. An example of the low-refractive-index hole transport material is TAPC described earlier. Here, it is preferable that the refractive index of the lower light-emitting layer 34 and the refractive index of the upper light-emitting layer 53 be equal, and that the low-refractive-index hole transport material contained in the hole generation layer 42 accordingly have a smaller refractive index than both of the refractive index of the lower light-emitting layer 34 and the refractive index of the upper light-emitting layer 53.

It is also noted that the lower hole transport layer 32 and/or the upper hole transport layer 51 (hole transport layer) may contain a low-refractive-index hole transport material.

The electron acceptance material contained in the hole generation layer 42 contains an electron-accepting compound. An electron-accepting compound ratio, which is the weight ratio of the electron-accepting compound contained in the hole generation layer 42 to the weight of the hole generation layer 42, is 10 to 50% inclusive. The electron-accepting compound ratio is more desirably 20% or greater (i.e., 20 to 50% inclusive). The electron-accepting compound preferably has a HOMO level of −8.0 to −7.0 eV inclusive, and the electron-accepting compound preferably has a LUMO level of −5.9 to −5.3 eV inclusive.

When the electron-accepting compound ratio is below 10%, the luminance and/or lifetime of the light-emitting element 101 is possibly insufficient because of a low density of holes that are generated in the structure of the electron generation layer 41, hole generation layer 42, and upper hole transport layer 51. When the electron-accepting compound ratio is over 50%, the luminance and/or lifetime of the light-emitting element 101 is possibly insufficient because of reduction in the effect of lowering the refractive index. Further, cost for manufacturing the light-emitting element 101 rises along with increase in the electron-accepting compound ratio; in view of this, it is undesirable that the electron-accepting compound ratio is over 50%.

The cap layer 24 preferably has a refractive index of 1.5 or smaller. Further, the ratio of the refractive index of the cap layer 24 to the refractive index of the upper electrode 23 is preferably 0.97 to 1.03 inclusive.

Although the foregoing has described, by way of example, that the cap layer 24 has a thickness of 50 to 200 nm inclusive in Step S17, the cap layer 24 preferably has a thickness of 50 to 500 nm inclusive. The cap layer 24 may be composed of an inorganic material or an organic material. In particular, the organic material that constitutes the cap layer 24 is preferably a high-molecular resin material.

It is preferable that a first visual angle θ1 at which light of a selected wavelength emitted from the lower light-emitting layer 34 exhibits a maximum resonance effect, and a second visual angle θ2 at which light of the selected wavelength emitted from the upper light-emitting layer 53 exhibits a maximum resonance effect be different. This can achieve the light-emitting element 101 with a high viewing angle characteristic. The first visual angle θ1 is 0 degrees for instance. The visual angles herein are each defined as an angle of inclination with respect to the normal of the lower light-emitting layer 34 and upper light-emitting layer 53 (denoted by a broken line in FIG. 1); that the visual angle is 0 degrees corresponds to the front view of the light-emitting element 101.

The lower light-emitting layer 34 is preferably thinner than the upper light-emitting layer 53.

Figure 6:
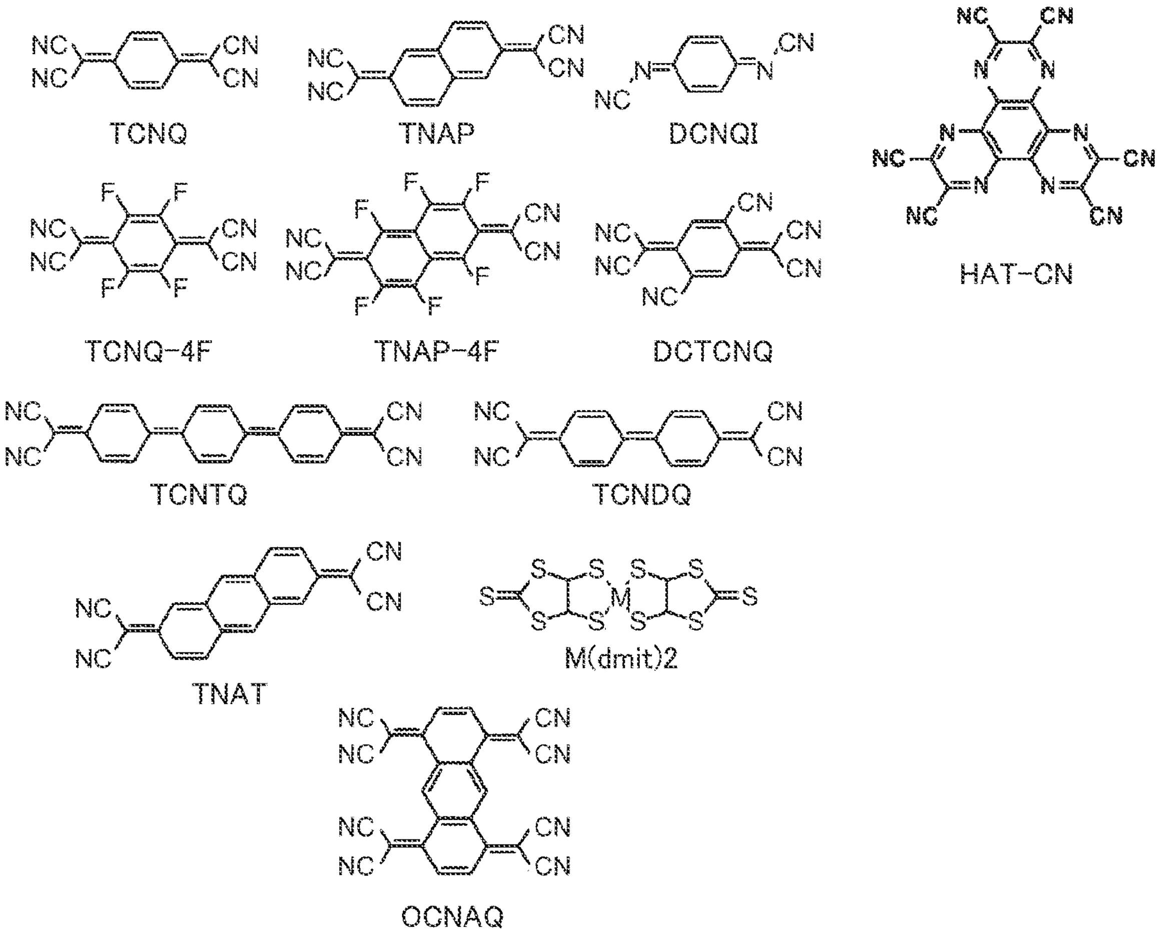
FIG. 6 illustrates examples of an electron-accepting compound.

FIG. 6 illustrates examples of the foregoing electron-accepting compound. The electron-accepting compound preferably contains at least one of the following compounds illustrated in FIG. 6. In particular, the electron-accepting compound preferably contains a fluorine group. The electron-accepting compound is preferably TCNQ-4F or TNAP-4F.

Tetracyanoquinodimethane (TCNQ)
Tetracyano-2,6-naphthoquinodimethane (TNAP)
Dicyanoquinomethane (DCNQI)
1,2,3,4-fluorinated tetracyanoquinodimethane (TCNQ-4F)
1,2,3,4,5,6-fluorinated tetracyano-2,6-naphthoquinodimethane (TNAP-4F)
Dicyanotetracyanoquinodimethan (DCTCNQ)
Tetracyanoterphenylquinomethane (TCNTQ)
Tetracyanodiphenylquinomethane (TCNDQ)
Tetracyanoanthracenylquinodimethan (TNAT)
M(dmit)2 (a kind of metal complexes)
Octacyanoanthracenylquinotetramethane (OCNAQ)
Dipyrazino[2,3-f:2', 3'-h]quinoxaline-2,3,6,7,10,11-hexacarbonitrile (HAT-CN)

Figure 7:
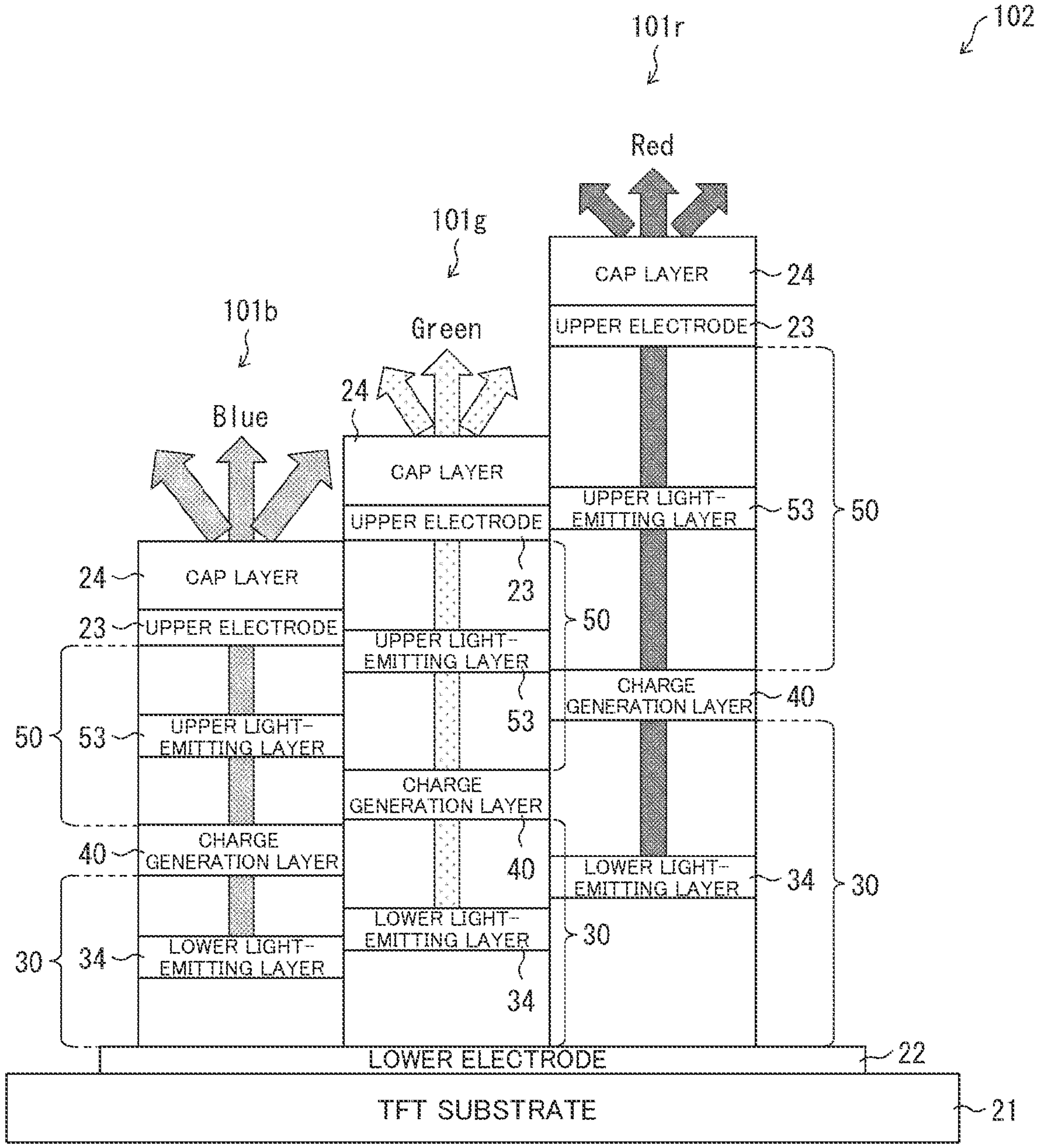
FIG. 7 is a sectional view of the schematic configuration of a display device according to the embodiment of the disclosure.

FIG. 7 is a sectional view of the schematic configuration of a display device 102 according to this embodiment. The display device 102 includes the following: a light-emitting element 101*r* that is the light-emitting element 101, and that emits red light; a light-emitting element 101*g* that is the light-emitting element 101, and that emits green light; and a light-emitting element 101*b* that is the light-emitting element 101, and that emits blue light. As illustrated in FIG. 7, the lower electrode 22 of the light-emitting element 101*r*, the lower electrode 22 of the light-emitting element 101*g*, and the lower electrode 22 of the light-emitting element 101*b* may be identical; that is, a single lower electrode 22 may be shared among the light-emitting element 101*r*, the light-emitting element 11*g*, and the light-emitting element 101*b*.

Example 1

Figure 8:
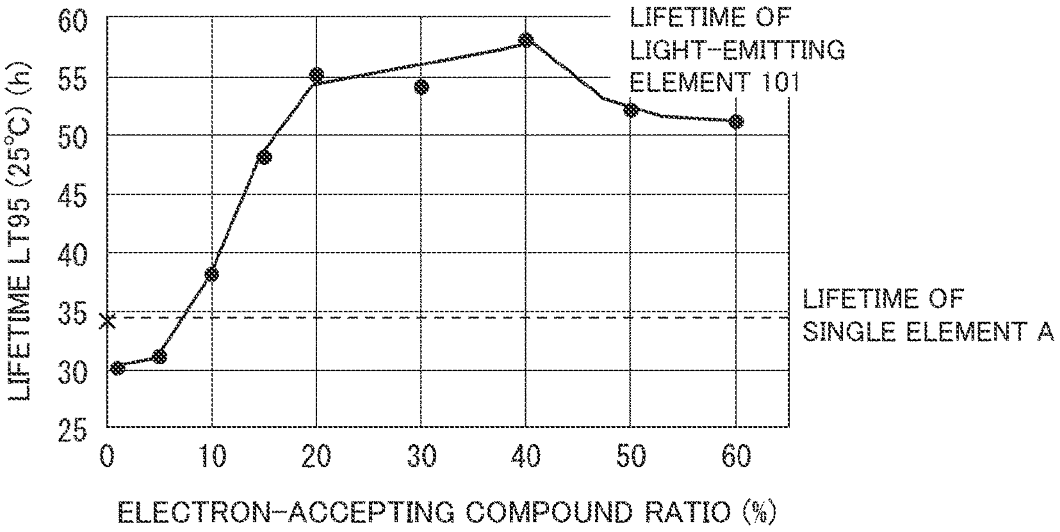
FIG. 8 is a table and graph showing evaluations on the characteristics of a light-emitting element according to Example 1.

FIG. 8 is a table and graph showing evaluations on the characteristics of the light-emitting element 101 according to this example.

The light-emitting element 101 according to this example has the following configuration. The low-refractive-index hole transport material contained in the hole generation layer 42 is TAPC, and the electron-accepting compound contained in the hole generation layer 42 is HAT-CN. HAT-CN has a HOMO level of −7.83 eV, and HAT-CN has a LUMO level of −5.60 eV The electron generation layer 41 is composed of an electron transport material (a HOMO level of −6.32 eV, and a LUMO level of −2.88 eV) with 10% of ytterbium added thereto.

Each column of the table shown in FIG. 8 is defined as follows. Further, the lateral axis of the graph shown in FIG. 8 indicates an electron-accepting compound ratio, and the longitudinal axis of the same indicates lifetime LT95 (25° C.).

Electron-accepting compound ratio (unit: %): an electron-accepting compound ratio
Efficiency (EQE) (unit:%): external quantum efficiency, an index for evaluating light emission efficiency
CIEx: CIE, a value of x in an XYZ color system
CIEy: CIE, a value of y in the XYZ color system
cd/A/y: luminosity (cd/A) with respect to current, divided by a value of y in the CIE XYZ color system, an index for evaluating light emission efficiency
Lifetime LT95 (25° C.) (unit: hour): time until luminance lowers to 95%, where atmospheric temperature measures 25° C., and where initial luminance stands at 100%, an index for evaluating lifetime The table and graph shown in FIG. 8 show evaluations made on the light-emitting element 101 according to this example, and on a single element A, which is a light-emitting element having a light-emitting layer that is a monolayer.

As seen from the table and graph shown in FIG. 8, the lifetime LT95 (25° C.) of the light-emitting element 101 according to this example exceeds the lifetime LT95 (25° C.) of the single element A when the electron-accepting compound ratio in the light-emitting element 101 according to this example is equal to or greater than 10%. This reveals that long life is achieved when the electron-accepting compound ratio in the light-emitting element 101 according to this example is equal to or greater than 10%.

The table shown in FIG. 8 reveals that the light emission efficiency (efficiency or EQE, and cd/A/y) of the light-emitting element 101 according to this example improves considerably when the electron-accepting compound ratio in the light-emitting element 101 according to this example is equal to or greater than 10%.

Example 2

Figure 9:
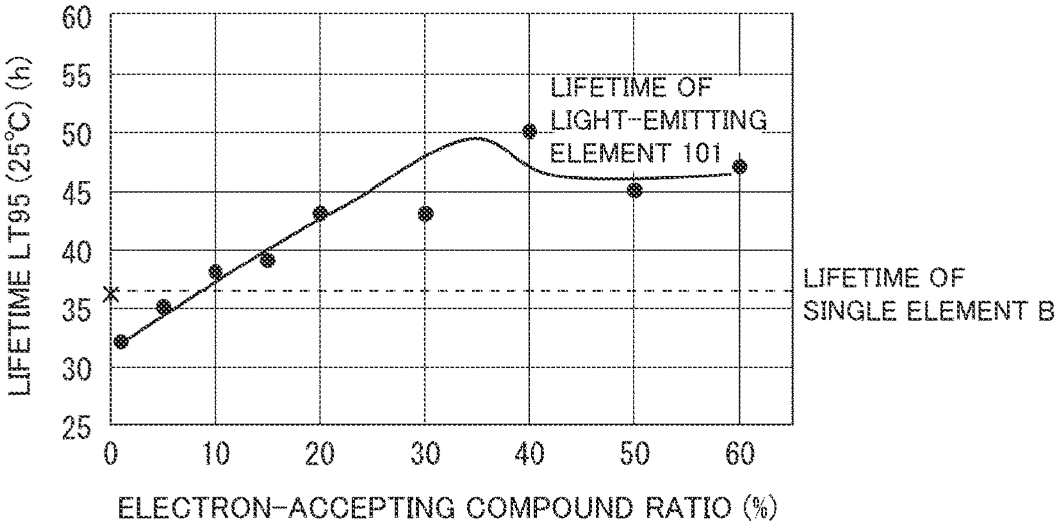
FIG. 9 is a table and graph showing evaluations on the characteristics of a light-emitting element according to Example 2.

FIG. 9 is a table and graph showing evaluations on the characteristics of the light-emitting element 101 according to this example.

The light-emitting element 101 according to this example is different from the light-emitting element 101 according to Example 1 in the following point. The electron-accepting compound contained in the hole generation layer 42 is TCNQ-4F. TCNQ-4F has a HOMO level of −7.75 eV, and TCNQ-4F has a LUMO level of −5.47 eV.

How to see the table and graph shown in FIG. 9 is the same as that in the table and graph shown in FIG. 8. The table and graph shown in FIG. 9 show evaluations made on the light-emitting element 101 according to this example, and on a single element B, which is a light-emitting element having a light-emitting layer that is a monolayer.

As seen from the table and graph shown in FIG. 9, the lifetime LT95 (25° C.) of the light-emitting element 101 according to this example exceeds the lifetime LT95 (25° C.) of the single element B when the electron-accepting compound ratio in the light-emitting element 101 according to this example is equal to or greater than 10%. This reveals that long life is achieved when the electron-accepting compound ratio in the light-emitting element 101 according to this example is equal to or greater than 10%.

The table shown in FIG. 9 reveals that the light emission efficiency of the light-emitting element 101 according to this example improves considerably when the electron-accepting compound ratio in the light-emitting element 101 according to this example is equal to or greater than 10%.

In view of rise in the manufacturing cost of the light-emitting element 101 due to increase in the amount of the electron-accepting compound, an electron-accepting compound ratio of 10 to 30% inclusive is conceivably highly effective.

Example 3

Figures 10, 11:
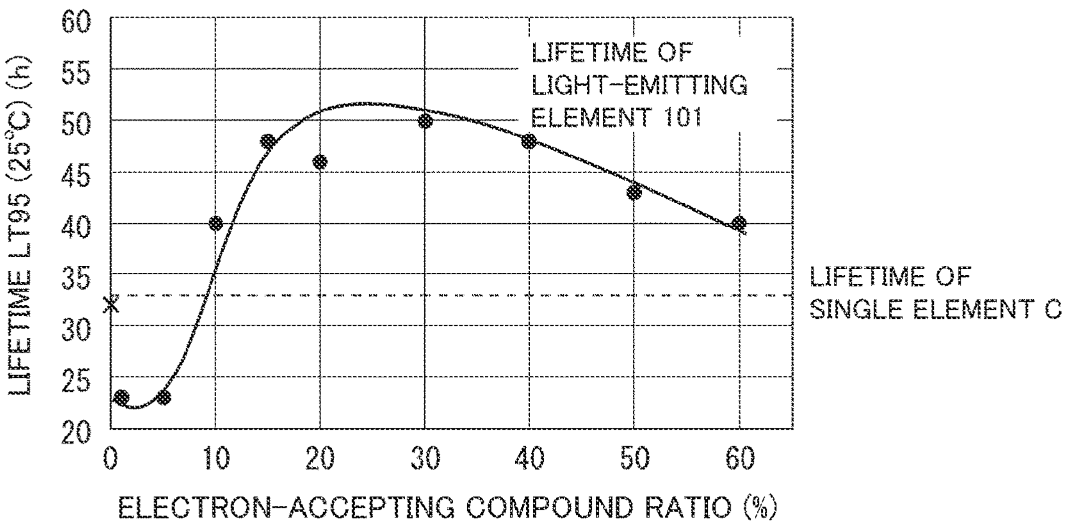
FIG. 10 is a table and graph showing evaluations on the characteristics of a light-emitting element according to Example 3.
FIG. 11 is a table showing evaluations on the characteristics of a light-emitting element according to Example 4.

FIG. 10 is a table and graph showing evaluations on the characteristics of the light-emitting element 101 according to this example.

The light-emitting element 101 according to this example is different from the light-emitting element 101 according to Example 1 in the following point. The electron-accepting compound contained in the hole generation layer 42 is TNAP-4F. TNAP-4F has a HOMO level of −7.23 eV, and TNAP-4F has a LUMO level of −5.55 eV The electron generation layer 41 is composed of an electron transport material (a HOMO level of −6.34 eV, and a LUMO level of −3.07 eV) with 5% of lithium added thereto.

How to see the table and graph shown in FIG. 10 is the same as that in the table and graph shown in FIG. 8. The table and graph shown in FIG. 10 show evaluations made on the light-emitting element 101 according to this example, and on a single element C, which is a light-emitting element having a light-emitting layer that is a monolayer.

As seen from the table and graph shown in FIG. 10, the lifetime LT95 (25° C.) of the light-emitting element 101 according to this example exceeds the lifetime LT95 (25° C.) of the single element C when the electron-accepting compound ratio in the light-emitting element 101 according to this example is equal to or greater than 10%. This reveals that long life is achieved when the electron-accepting compound ratio in the light-emitting element 101 according to this example is equal to or greater than 10%.

The table shown in FIG. 10 reveals that the light emission efficiency of the light-emitting element 101 according to this example improves considerably when the electron-accepting compound ratio in the light-emitting element 101 according to this example is equal to or greater than 10%.

In view of rise in the manufacturing cost of the light-emitting element 101 due to increase in the amount of the electron-accepting compound, an electron-accepting compound ratio of 10 to 30% inclusive is conceivably highly effective.

Example 4

FIG. 11 is a table showing evaluations on the characteristics of the light-emitting element 101 according to this example.

The light-emitting element 101 according to this example is different from the light-emitting element 101 according to Example 1 in the following point. The hole transport material contained in each of the lower electron blocking layer 33 and upper electron blocking layer 52 is TAPC (a refractive index of 1.60), which is a low-refractive-index hole transport material. The lower electron blocking layer 33 and the upper electron blocking layer 52 are each 10 nm thick. The first visual angle θ1 is 0 degrees, and the second visual angle θ2 is 45 degrees. The electron-accepting compound contained in the hole generation layer 42 is HAT-CN, and the electron-accepting compound ratio is 20%. The cap layer 24 has a refractive index of 1.38. The cap layer 24 is 100 nm thick.

An example method for manufacturing the light-emitting element 101 according to this example is shown in FIG. 2; to be specific, the method includes evaporation of TAPC in each of Steps S4 and S11, and setting the electron-accepting compound ratio at 20% in Step S9.

How to see the table shown in FIG. 11 is the same as that in the table shown in FIG. 8. The table shown in FIG. 11 show evaluations made on the light-emitting element 101 according to this example, and on a light-emitting element according to Comparative Example 1. The light-emitting element according to Comparative Example 1 is different from the light-emitting element 101 (a refractive index of 1.60) according to this example in that each of the lower electron blocking layer 33 and upper electron blocking layer 52 has a refractive index of 1.75.

The table shown in FIG. 11 reveals that when compared with the light-emitting element according to Comparative Example 1, the light-emitting element 101 according to this example has about 12% higher efficiency (EQE) and about 15% higher cd/A/y. The table also reveals that even when compared with the light-emitting element 101 according to Example 1 with its electron-accepting compound ratio set at 20% (see FIG. 8), the light-emitting element 101 according to this example has about 6% higher efficiency (EQE) and about 7% higher cd/A/y. That is, the table reveals that using TAPC, which is a low-refractive-index hole transport material, as a hole transport material that is contained in each of the lower electron blocking layer 33 and upper electron blocking layer 52 leads to enhancement in the light emission efficiency of the light-emitting element 101.

Figure 12:
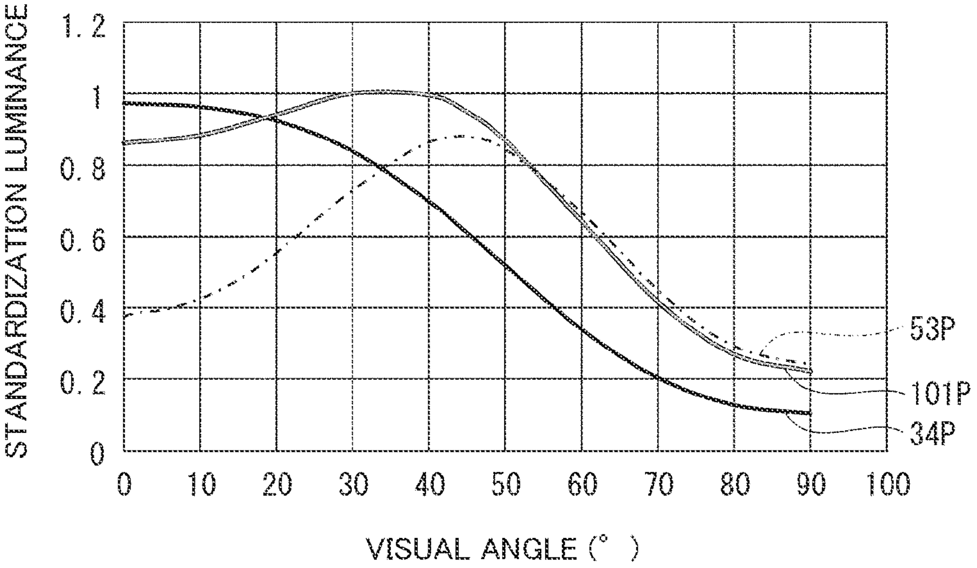
FIG. 12 is a graph showing the visual angle-standardization luminance characteristic of a lower light-emitting layer of the light-emitting element according to Example 4, the visual angle-standardization luminance characteristic of an upper light-emitting layer of the light-emitting element according to Example 4, and the visual angle-standardization luminance characteristic of the light-emitting element according to Example 4.
Figure 13:
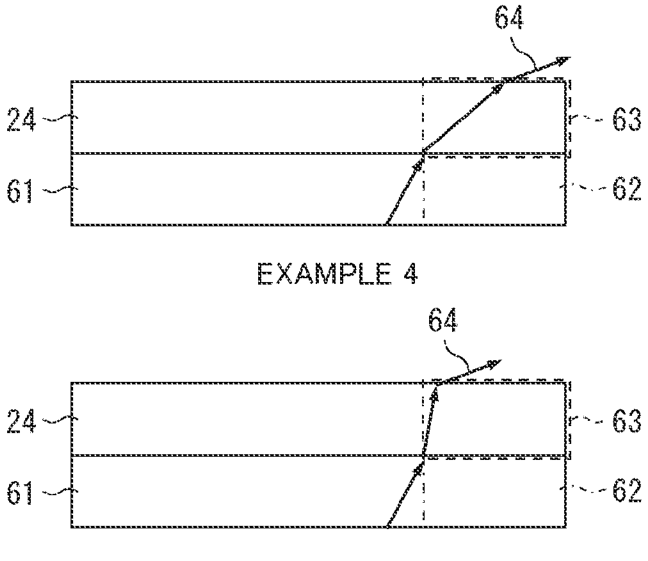
FIG. 13 shows a comparison between a cap layer of the light-emitting element according to Example 4 as well as an optical path through the cap layer and its vicinity, and a cap layer of a light-emitting element according to Comparative Example 2 as well as an optical path through the cap layer and its vicinity.

FIG. 12 is a graph showing a characteristic 34P, which is the visual angle (lateral axis; unit: degree)-standardization luminance (longitudinal axis) characteristic of the lower light-emitting layer 34 of the light-emitting element 101 according to this example, a characteristic 53P, which is the visual angle-standardization luminance characteristic of the upper light-emitting layer 53 of the light-emitting element 101 according to this example, and a characteristic 101P, which is the visual angle-standardization luminance characteristic of the light-emitting element 101. FIG. 13 shows a comparison between the cap layer 24 (a refractive index of 1.38) of the light-emitting element 101 according to this example as well as a nearby optical path, and the cap layer 24 (a refractive index of 1.75) of a light-emitting element according to Comparative Example 2 as well as a nearby optical path. The light-emitting element according to Comparative Example 2 is the same as the light-emitting element 101 according to this example with the exception that the refractive index of the cap layer 24 is different between them.

An element body 61 includes a color separation (CS) region 62 when the each of the foregoing light-emitting elements is composed of the element body 61, corresponding to the stacked structure of the TFT substrate 21 through the upper electrode 23, and of the cap layer 24. The cap layer 24 has a first region 63 directly on the CS region 62; an optical path 64 passing through the cap layer 24 and its vicinity, and positioned in the first region 63 is longer in the light-emitting element 101 according to this example than in the light-emitting element according to Comparative Example 2. That is, this reveals that the light-emitting element 101 according to this example uses the first region 63 more effectively with regard to light emission than the light-emitting element according to Comparative Example 2.

FIG. 14 is a graph showing the relationship in CS cover length (longitudinal axis; unit: nm) with respect to an angle (lateral axis; unit: degree) of light incident from the element body 61 to the cap layer 24, between the light-emitting element 101 according to this example and the light-emitting element according to Comparative Example 2, where the normal (see FIG. 1) of the lower light-emitting layer 34 and upper light-emitting layer 53 is set at 0 degrees. The CS cover length is the length of a portion that is in a direction perpendicular to the normal, and that allows the light in the first region 63 to pass (i.e., a length that enables light emission). The direction perpendicular to the normal corresponds to the side-to-side direction of each light-emitting element in FIG. 13.

As seen from the graph shown in FIG. 14, the light-emitting element 101 according to this example has a longer CS cover length for an identical incident angle than the light-emitting element according to Comparative Example 2, and their difference in the CS cover length becomes conspicuous along with increase in the identical incident angle. For an incident angle of 45 degrees for instance, the light-emitting element according to Comparative Example 2 has a CS cover length of about 100 nm, whereas the light-emitting element 101 according to this example has a CS cover length of about 240 nm, which is 2 times or greater of the former CS cover length.

Reference is made to the light-emitting element 101 according to this example that is the light-emitting element 101*b* illustrated in FIG. 7. The size of a single pixel (excluding the CS region) corresponding to the light-emitting element 101*b* is 19.8 mm square for instance. The light-emitting element 101*b* can emit light having an incident angle of 45 degrees, without color shifting and can thus improve the light emission efficiency substantially about 4.9% on the basis of the following mathematical expression. It is noted that the following mathematical expression is calculated on the condition that the size of this single pixel (including the CS region) is 20.28 mm square.

$$((20.28)^2)/((19.8)^2)=1.049$$

Doubling the thickness of the cap layer 24 doubles the CS cover length (the light emission efficiency improves 10.2% numerically). This improvement in the ratio of the CS cover length to the width of the first region 63 in the direction perpendicular to the foregoing normal is conceivably equivalent to the improvement in the light emission efficiency of the light-emitting element 101.

Example 5

FIG. 15 is a table showing evaluations on the characteristics of the light-emitting element 101 according to this example.

The light-emitting element 101 according to this example is different from the light-emitting element 101 according to Example 1 in the following point. The hole transport material contained in each of the lower electron blocking layer 33 and upper electron blocking layer 52 is TAPC (a refractive index of 1.60), which is a low-refractive-index hole transport material. The lower electron blocking layer 33 and the upper electron blocking layer 52 are each 10 nm thick. The first visual angle θ1 is 0 degrees, and the second visual angle θ2 is 25 degrees. The electron-accepting compound contained in the hole generation layer 42 is TCNQ-4F, and the electron-accepting compound ratio is 20%. The cap layer 24 has a refractive index of 1.39. The cap layer 24 is 150 nm thick.

How to see the table shown in FIG. 15 is the same as that in the table shown in FIG. 8.

The table shown in FIG. 15 reveals that when compared with the light-emitting element 101 according to Example 2 with its electron-accepting compound ratio set at 20% (see FIG. 9), the light-emitting element 101 according to this example has about 3% higher efficiency (EQE) and about 3% higher cd/A/y. That is, the table reveals that using TAPC, which is a low-refractive-index hole transport material, as a hole transport material that is contained in each of the lower electron blocking layer 33 and upper electron blocking layer 52 leads to enhancement in the light emission efficiency of the light-emitting element 101.

FIG. 16 is a graph showing a characteristic 34Q, which is the visual angle (lateral axis; unit: degree)-standardization luminance (longitudinal axis) characteristic of the lower light-emitting layer 34 of the light-emitting element 101 according to this example, and a characteristic 53Q, which is the visual angle-standardization luminance characteristic of the upper light-emitting layer 53 of the light-emitting element 101 according to this example.

Figure 17:
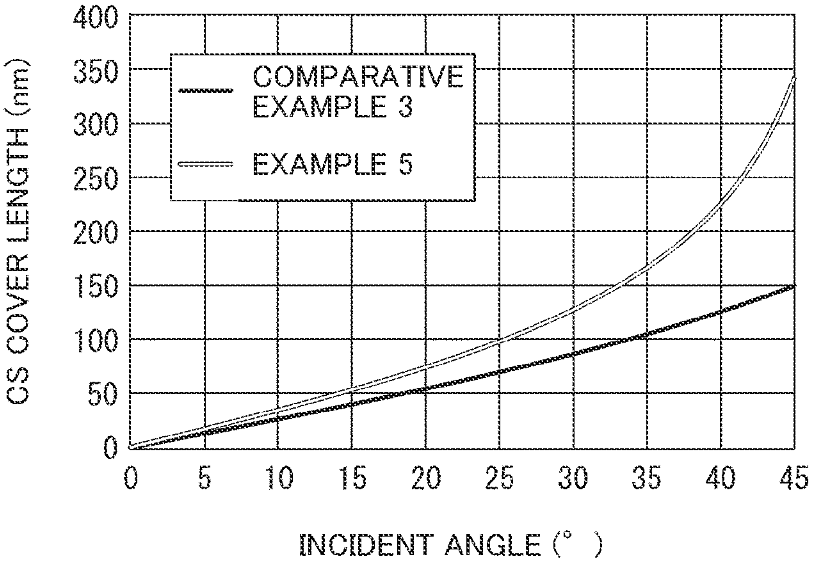
FIG. 17 is a graph showing the relationship in CS cover length with respect to an angle of light incident from the element body to the cap layer, between the light-emitting element according to Example 5 and a light-emitting element according to Comparative Example 3, where the normal of the lower and upper light-emitting layers is set at 0 degrees.

FIG. 17 is a graph showing the relationship in the CS cover length (longitudinal axis; unit: nm) with respect to an angle (lateral axis; unit: degree) of light incident from the element body 61 to the cap layer 24, between the light-emitting element 101 according to this example and a light-emitting element according to Comparative Example 3, where the normal (see FIG. 1) of the lower light-emitting layer 34 and upper light-emitting layer 53 is set at 0 degrees. The light-emitting element according to Comparative Example 3 is the same as the light-emitting element 101 according to this example with the exception that the refractive index of the cap layer 24 is different between them (a refractive index of 1.39 in this example, and a refractive index of 1.75 in Comparative Example 3).

As seen from the graph shown in FIG. 17, the light-emitting element 101 according to this example has a longer CS cover length for an identical incident angle than the light-emitting element according to Comparative Example 3, and their difference in the CS cover length becomes conspicuous along with increase in the identical incident angle. For an incident angle of 45 degrees for instance, the light-emitting element according to Comparative Example 3 has a CS cover length of about 150 nm, whereas the light-emitting element 101 according to this example has a CS cover length of about 340 nm, which is 2 times or greater of the former CS cover length.

The light-emitting element according to this example, which includes three low-refractive-index layers, offers an about 1.3% efficiency (EQE) improvement and an about 3% cd/A/y improvement when compared with that according to Example 1.

Reference is made to the light-emitting element 101 according to this example that is the light-emitting element 101*b* illustrated in FIG. 7. The size of a single pixel (excluding the CS region) corresponding to the light-emitting element 101*b* is 19.8 mm square for instance. The incident angle is 25 degrees, and the CS cover length is 100 nm. The foregoing can improve the light emission efficiency substantially about 2% on the basis of the following mathematical expression. It is noted that the following mathematical expression is calculated on the condition that the size of this single pixel (including the CS region) is 20.0 mm square.

$$((20.0)^2)/((19.8)^2) = 1.020$$

Summary

A light-emitting element according to a first aspect of the disclosure includes the following: a lower electrode having light reflectivity; an upper electrode having light transparency and light reflectivity; a lower light-emitting layer and an upper light-emitting layer disposed between the lower electrode and the upper electrode; and a charge generation layer disposed between the lower light-emitting layer and the upper light-emitting layer. The charge generation layer has a hole generation layer configured to generate holes, and an electron generation layer configured to generate electrons. The hole generation layer has a hole transport material having a smaller refractive index than at least one of the refractive index of the lower light-emitting layer and the refractive index of the upper light-emitting layer, and the hole generation layer has an electron-accepting compound. An electron-accepting compound ratio is 10 to 50% inclusive, wherein the electron-accepting compound ratio is the weight ratio of the electron-accepting compound contained in the hole generation layer to the weight of the hole generation layer.

The light-emitting element according to a second aspect of the disclosure is configured, in the first aspect, such that the electron-accepting compound ratio is 20% or greater.

The light-emitting element according to a third aspect of the disclosure is configured, in the first or second aspect, such that the electron-accepting compound has a HOMO level of −8.0 to −7.0 eV inclusive, and such that the electron-accepting compound has a LUMO level of −5.9 to −5.3 eV inclusive.

The light-emitting element according to a fourth aspect of the disclosure is configured, in any one of the first to third aspects, such that the electron-accepting compound contains at least one of TCNQ, TNAP, DCNQI, TCNQ-4F, TNAP-4F, DCTCNQ, TCNTQ, TCNDQ, TNAT, M(dmit)2, OCNAQ, and HAT-CN.

The light-emitting element according to a fifth aspect of the disclosure is configured, in the fourth aspect, such that the electron-accepting compound contains a fluorine group.

The light-emitting element according to a sixth aspect of the disclosure is configured, in any one of the first to third aspects, such that the electron-accepting compound is TCNQ-4F or TNAP-4F.

The light-emitting element according to a seventh aspect of the disclosure is configured, in any one of the first to sixth aspects, such that the refractive index of the hole transport material is 0.90 times or greater and 0.95 times or smaller of at least one of the refractive index of the lower light-emitting layer and the refractive index of the upper light-emitting layer.

The light-emitting element according to an eighth aspect of the disclosure is configured, in any one of the first to seventh aspects, such that the hole transport material has a refractive index of 1.70 to 1.90 inclusive.

The light-emitting element according to a ninth aspect of the disclosure is configured, in any one of the first to eighth aspects, such that the hole transport material is TAPC.

The light-emitting element according to a tenth aspect of the disclosure is configured, in any one of the first to ninth aspects, such that the electron generation layer is in contact with the hole generation layer and is composed of a material with ytterbium or lithium added to an electron transport material.

The light-emitting element according to an eleventh aspect of the disclosure is configured, in the tenth aspect, such that the electron transport material is an organic electron-transporting material.

The light-emitting element according to a twelfth aspect of the disclosure is configured, in any one of the first to eleventh aspects, such that the light-emitting element includes a hole transport layer, and such that the hole transport layer contains the hole transport material.

The light-emitting element according to a thirteenth aspect of the disclosure includes, in any one of the first to twelfth aspects, a cap layer disposed over the upper electrode. The cap layer has a refractive index of 1.5 or smaller.

The light-emitting element according to a fourteenth aspect of the disclosure is configured, in the thirteenth aspect, such that the cap layer has a thickness of 50 to 500 nm inclusive.

The light-emitting element according to a fifteenth aspect of the disclosure is configured, in the thirteenth or fourteenth aspect, such that the cap layer is composed of an inorganic material.

The light-emitting element according to a sixteenth aspect of the disclosure is configured, in the thirteenth or fourteenth aspect, such that the cap layer is composed of an organic material.

The light-emitting element according to a seventeenth aspect of the disclosure is configured, in the sixteenth aspect, such that the organic material is a high-molecular resin material.

The light-emitting element according to an eighteenth aspect of the disclosure is configured, in any one of the thirteenth to seventeenth aspects, such that the ratio of the refractive index of the cap layer to the refractive index of the upper electrode is 0.97 to 1.03 inclusive.

The light-emitting element according to a nineteenth aspect of the disclosure is configured, in any one of the first to eighteenth aspects, such that a first visual angle at which light of a selected wavelength emitted from the lower light-emitting layer exhibits a maximum resonance effect, and a second visual angle at which light of the selected wavelength emitted from the upper light-emitting layer exhibits a maximum resonance effect are different.

The light-emitting element according to a twentieth aspect of the disclosure is configured, in the nineteenth aspect, such that the first visual angle is 0 degrees.

The light-emitting element according to a twenty-first aspect of the disclosure is configured, in any one of the first to twentieth aspects, such that the lower light-emitting layer is thinner than the upper light-emitting layer.

The light-emitting element according to a twenty-second aspect of the disclosure is configured, in any one of the first to twenty-first aspects, such that the hole generation layer is disposed closer to the upper electrode than the electron generation layer.

The light-emitting element according to a twenty-third aspect of the disclosure is configured, in any one of the first to twenty-second aspects, such that the refractive index of the lower light-emitting layer and the refractive index of the upper light-emitting layer are equal.

A display device according to a twenty-fourth aspect of the disclosure includes the light-emitting element according to any one of the first to twenty-third aspects.

The disclosure is not limited to the foregoing embodiment. Various modifications can be devised within the scope of the claims. An embodiment that is obtained in combination, as appropriate, with technical means disclosed in respective embodiments is also included in the technical scope of the disclosure. Furthermore, combining the technical means disclosed in the respective embodiments can form a new technical feature.

The invention claimed is:

1. A light-emitting element comprising:

a lower electrode having light reflectivity;

an upper electrode having light transparency and light reflectivity;

a lower light-emitting layer and an upper light-emitting layer disposed between the lower electrode and the upper electrode; and a charge generation layer disposed between the lower light-emitting layer and the upper light-emitting layer, wherein:

the charge generation layer has a hole generation layer configured to generate holes, and an electron generation layer configured to generate electrons, the hole generation layer has a hole transport material having a smaller refractive index than at least one of a refractive index of the lower light-emitting layer and a refractive index of the upper light-emitting layer, and the hole generation layer has an electron-accepting compound, and an electron-accepting compound ratio is 10 to 50%, inclusive, the electron-accepting compound ratio being a weight ratio of a weight of the electron-accepting compound contained in the hole generation layer to a weight of the hole generation layer.

2. The light-emitting element according to claim 1, wherein the electron-accepting compound ratio is 20% or greater.

3. The light-emitting element according to claim 1, wherein the electron-accepting compound has a highest occupied molecular orbital (HOMO) level of −8.0 to −7.0 eV, inclusive, and the electron-accepting compound has a lowest unoccupied molecular orbital (LUMO) level of −5.9 to −5.3 eV, inclusive.

4. The light-emitting element according to claim 1, wherein the electron-accepting compound contains at least one of TCNQ, TNAP, DCNQI, TCNQ-4F, TNAP-4F, DCTCNQ, TCNTQ, TCNDQ, TNAT, M(dmit)2, OCNAQ, and HAT-CN.

5. The light-emitting element according to claim 4, wherein the electron-accepting compound contains a fluorine group.

6. The light-emitting element according to claim 1, wherein the electron-accepting compound is TCNQ-4F or TNAP-4F.

7. The light-emitting element according to claim 1, wherein a refractive index of the hole transport material is 0.90 times or greater and 0.95 times or smaller of the at least one of the refractive index of the lower light-emitting layer and the refractive index of the upper light-emitting layer.

8. The light-emitting element according to claim 1, wherein the hole transport material has a refractive index of 1.70 to 1.90, inclusive.

9. The light-emitting element according to claim 1, wherein the hole transport material is TAPC.

10. The light-emitting element according to claim 1, wherein the electron generation layer is in contact with the hole generation layer and comprises a material with ytterbium or lithium added to an electron transport material.

11. The light-emitting element according to claim 10, wherein the electron transport material is an organic electron-transporting material.

12. The light-emitting element according to claim 1, wherein the light-emitting element includes a hole transport layer, and the hole transport layer contains the hole transport material.

13. The light-emitting element according to claim 1, further comprising a cap layer disposed over the upper electrode, wherein the cap layer has a refractive index of 1.5 or smaller.

14. The light-emitting element according to claim 13, wherein the cap layer has a thickness of 50 to 500 nm, inclusive.

15. The light-emitting element according to claim 1, wherein a first visual angle, at which light of a selected wavelength emitted from the lower light-emitting layer exhibits a maximum resonance effect, and a second visual angle, at which light of the selected wavelength emitted from the upper light-emitting layer exhibits a maximum resonance effect, are different.

16. The light-emitting element according to claim 15, wherein the first visual angle is 0 degrees.

17. The light-emitting element according to claim 1, wherein the lower light-emitting layer is thinner than the upper light-emitting layer.

18. The light-emitting element according to claim 1, wherein the hole generation layer is disposed closer to the upper electrode than the electron generation layer.

19. The light-emitting element according to claim 1, wherein the refractive index of the lower light-emitting layer and the refractive index of the upper light-emitting layer are equal.

20. A display device comprising the light-emitting element according to claim 1.

* * * * *